United States Patent

Ruigrok et al.

[11] Patent Number: 5,600,297
[45] Date of Patent: Feb. 4, 1997

[54] MAGNETIC FIELD SENSOR

[75] Inventors: Jacobus J. M. Ruigrok; Martinus A. M. Gijs; Jacques C. S. Kools; Reinder Coehoorn; Wiepke Folkerts, all of Eindhoven, Netherlands

[73] Assignee: U.S. Philips Corporation, New York, N.Y.

[21] Appl. No.: 517,156

[22] Filed: Aug. 21, 1995

[30] Foreign Application Priority Data

Aug. 28, 1994 [EP] European Pat. Off. .............. 94202458

[51] Int. Cl.$^6$ ............................................. H01L 43/00
[52] U.S. Cl. .................... 338/32 R; 324/207.21; 324/249
[58] Field of Search ...................... 338/32 R; 324/207.21, 324/252, 247, 249

[56] References Cited

U.S. PATENT DOCUMENTS

| | | | |
|---|---|---|---|
| 3,382,448 | 5/1968 | Oberg et al. | 338/22 R |
| 3,947,889 | 3/1976 | Lazzari | 338/32 R |
| 4,385,273 | 5/1983 | Lienhard et al. | 324/249 |
| 5,021,909 | 6/1991 | Shiiba | 338/32 R |
| 5,026,590 | 4/1993 | Dieny et al. | 324/252 |
| 5,243,316 | 9/1993 | Sakakima et al. | 338/32 R |

FOREIGN PATENT DOCUMENTS

| | | | |
|---|---|---|---|
| 0539213 | 4/1993 | European Pat. Off. | 338/32 R |
| 6-97532A | 4/1994 | Japan | 338/32 R |

OTHER PUBLICATIONS

Shinjo and Yamamoto in J. Phys, Soc. Jap. 59(9), 1990, pp. 3061–3064.

Guo and Zhu in J. Appl. Phys. 75(10), 1994, pp. 6388–6390.

*Primary Examiner*—Teresa J. Walberg
*Assistant Examiner*—Karl Easthom
*Attorney, Agent, or Firm*—John C. Fox

[57] ABSTRACT

A device for detecting a magnetic field, which device comprises a magneto-resistive multilayer structure comprising a first magnetic layer (1) which is separated from a second magnetic layer by an interposed non-magnetic layer, the multilayer structure having a first in-plane reference axis ($R_1$) coinciding with the direction in which magnetic flux is offered to the multilayer structure during operation, and a second in-plane reference axis ($R_2$) which is perpendicular to the first reference axis ($R_1$), whereby the magnetic easy axis ($E_1$) of the first magnetic layer (1) is canted through an acute in-plane angle $\alpha$ with respect to the second reference axis ($R_2$), and the magnetic easy axis ($E_2$) of the second magnetic layer is canted in the opposite sense through an acute in-plane angle $\beta$ with respect to the second reference axis ($R_2$). Such a device lends itself to application in a magnetic head, for sensitive retrieval of magnetically-encoded data from a carrier in the form of a tape, disc or card.

17 Claims, 5 Drawing Sheets

MAGNETIC FIELD SENSOR

The invention relates to a device for detecting a magnetic field, which device comprises a magneto-resistive multilayer structure comprising a first magnetic layer which is separated from a second magnetic layer by an interposed non-magnetic layer, the multilayer structure having a first in-plane reference axis coinciding with the direction in which magnetic flux is offered to the multilayer structure during operation, and a second in-plane reference axis which is perpendicular to the first reference axis.

The invention also relates to a magnetic head incorporating such a device.

A device of this type can be employed to exploit the so-called spin-valve magneto-resistance effect, whereby the electrical resistance demonstrated by the device depends upon the relative orientation of the magnetisation vectors in the first and second magnetic layers, which can in turn be influenced by an external magnetic field. The device can therefore be used to translate a varying applied magnetic field into a fluctuating electrical signal, thereby allowing electrical read-out of the magnetically-encoded information in a moving data-carrier, for example. Alternatively, it can be applied in such instruments as tachometers and magnetic compasses.

In general, the magnitude of the magneto-resistance effect in such devices is relatively small, being typically of the order of 1–10% at room temperature. As a result, device-generated noise must be kept to a minimum if an acceptable signal-to-noise ratio is to be obtained.

A device as specified in the opening paragraph is further elucidated in the article by Shinjo and Yamamoto in J. Phys. Soc. Jap. 59(9), 1990, pp 3061–3064, wherein the first magnetic layer comprises Co, the second magnetic layer comprises a NiFe alloy (permalloy), and the interposed non-magnetic layer comprises Cu. The magnetic easy axes of the first and second magnetic layers are mutually parallel, and the external magnetic field employed in the discussed experimental tests of the device is applied along the direction of these axes. As shown in FIG. 2 of the article, this magnetic field can be used to manipulate the magnetisation vectors in the first and second magnetic layers between mutually parallel and mutually anti-parallel configurations, corresponding respectively to minimal and maximal observed electrical resistance.

A disadvantage of this known device is that it demonstrates a relatively high magnetic hysteresis (as is clearly evident from FIG. 1 of the article), with associated increased Barkhausen noise. This is attributable to the fact that magnetisation-reversal in the device does not occur exclusively via a pure rotation of the magnetisation vectors of the magnetic layers, but is also partly governed by domain wall movement. This can be explained as follows.

A resultant magnetisation vector M which has been directionally reversed by application of an external magnetic field H is thereby brought into a metastable state, since, when the field H is removed, the vector M can relax and revert to its original orientation by rotating in either of two directions. In general, however, the spatial M-distribution will split up into distinct parts, each of which will rotate back to the relaxed state in a different direction. It is this splitting which gives rise to formation of at least one domain wall.

In order to circumvent this problem, one might be tempted to employ an alternative measurement geometry, in which the applied magnetic field is no longer directed along the magnetic easy axes of the device. Such a geometry is elucidated for example by Guo and Zhu in J. Appl. Phys. 75(10), 1994, pp 6388–6390. In this theoretical article, the external magnetic field H is applied perpendicular to the easy axes of the first and second magnetic layers, as shown in FIG. 1 of the article. As H increases in magnitude, the magnetisation vectors $M_1$ and $M_2$ of the first and second magnetic layers rotate toward it through an angle θ, and two possible scenarios can be further distinguished:

(1) For relatively low applied field values, $M_1$ and $M_2$ will never actually become parallel to H. As a result, they will not be brought into a roetastable state, since each vector will only have one "easiest path" back to its original orientation (as depicted in FIG. 1, these paths are counterclockwise for $M_1$ and clockwise for $M_2$);

(2) For sufficiently high applied field values, however, $M_1$ and $M_2$ will eventually become (substantially) parallel to H and, consequently, will be brought into a similar metastable state to that elucidated earlier hereabove.

Substantial magnetic hysteresis will therefore still occur in scenario (2).

It is an object of the invention to provide a magnetic field sensor having a reduced magnetic hysteresis.

This and other objects are achieved in a magnetic field sensor as specified in the opening paragraph, characterised in that the magnetic easy axis of the first magnetic layer is canted through an acute in-plane angle α with respect to the second reference axis, and that the magnetic easy axis of the second magnetic layer is canted in the opposite sense through an acute in-plane angle β with respect to the second reference axis.

The phrase "direction in which magnetic flux is offered to the multilayer structure during operation" refers to the direction of an externally applied magnetic field as such a field is experienced by the multilayer structure itself. In general, this external field will be transferred to the multilayer structure via means such as a magnetic yoke into which the multilayer structure is incorporated. Regardless of the direction of the external field at the point where it is picked up by the pole faces of the yoke, the above phrase refers to the orientation of the corresponding magnetic flux as it is offered by the yoke to the plane of the multilayer structure. Of course, the external field can also be intercepted by the multilayer structure without the aid of a yoke.

The phrase "acute in-plane angle" should be interpreted as referring to a positive non-zero angle of magnitude less than 90 degrees, which is subtended within the plane of the multilayer structure. With respect to a given axis, such an angle can be subtended in one of two opposite senses, e.g. clockwise or counterclockwise.

The inventive insights underlying the device according to the invention can be elucidated as follows, whereby:

The first and second reference axes will be denoted by $R_1$ and $R_2$, respectively;

The magnetic easy axes of the first and second magnetic layers will be referred to as $E_1$ and $E_2$, respectively;

The (resultant) magnetisation vectors of the first and second magnetic layer will be labelled $M_1$ and $M_2$, respectively.

In terms of this nomenclature, the inventive measure ensures that $E_1$ and $E_2$ are not mutually parallel, and that neither $E_1$ nor $E_2$ is perpendicular to $R_1$. As the strength of a magnetic field H applied along $R_1$ is increased, both $M_1$ and $M_2$ will be gradually forced towards parallelism with $R_1$. However, even at saturation, when both $M_1$ and $M_2$ are substantially parallel to $R_1$, neither magnetisation vector will be perpendicular to its respective magnetic easy axis, so that it will never exist in a roetastable state of the type described hereabove. Magnetisation relaxation upon removal of the external field H will therefore always occur via a single "easiest path", without domain wall formation. The magnetic hysteresis of the inventive device is consequently drastically reduced as compared to that of conventional devices.

The required canting of $E_1$ and $E_2$ with respect to $R_1$ can be achieved by growing the first and second magnetic layers in the presence of an applied magnetic field $H_o$ of a given orientation. Because $E_1$ and $E_2$ are not allowed to be mutually parallel, it must be possible either to adjust the orientation of $H_o$, or to rotate the multilayer structure with respect to a fixed orientation of $H_o$. The former can be achieved, for example, by growing the structure on a substrate which is positioned within the confines and in the plane of a closed magnetic yoke on which two pairs of electrical coils are wound, thereby forming a quadrupole electromagnet. The direction and intensity of the net magnetic field produced by such a quadrupole arrangement can be adjusted by suitable choice of two steering electrical currents through the two coil pairs. Typically, a magnetic field strength of about 100–300 Oe is sufficient to produce the required canting in typically-employed magnetic materials, such as permalloy.

Preferential values of the canting-angles $\alpha$ and $\beta$ are determined by the interplay of two main considerations for a given device:

(a) A typical spin-valve magneto-resistive element generally demonstrates maximal electrical resistance for an anti-parallel configuration of $M_1$ and $M_2$, and minimal electrical resistance for a parallel configuration of $M_1$ and $M_2$. In the case of the present inventive device, the latter configuration can occur along $R_1$ under the influence of a sufficiently strong applied magnetic field. However, the (exact) former configuration will not occur when this applied field is relaxed, since $E_1$ and $E_2$ are deliberately non-parallel according to the invention. Therefore, the greater the degree of parallelism of $E_1$ and $E_2$ to $R_2$ (i.e. the smaller the values of $\alpha$ and $\beta$), the larger will be the device's relative resistance-difference between the "field on" and "field off" states;

(b) On the other hand, the values of $\alpha$ and $\beta$ should not be too small, since diminished values tend to increase the risk of occurrence of an unwanted metastable state during saturation. This is because of the possible occurrence of so-called dispersion effects and edge irregularities, whereby local circumstances can cause the orientation of given individual magnetisations to strongly deviate from the statistical average in the rest of the magnetic layer in question.

With regard to point (a), a good practical compromise is achieved for $0<\alpha<45°$ and $0<\beta<45°$, and particularly satisfactory results are obtained when $\alpha\leq20°$ and $\beta\leq20°$; however, values of $\alpha$ and $\beta$ in excess of 45° are still usable. Where point (b) is concerned, it is preferable (though not strictly necessary) to have both $\alpha$ and $\beta$ greater than 5°. It should be noted that $\alpha$ and $\beta$ can be either equal or unequal, according to choice.

An advantageous embodiment of the device according to the invention is characterised in that the first magnetic layer and the second magnetic layer are antiferromagnetically coupled to one another. In such an embodiment, vectors $M_1$ and $M_2$ will only be parallel in the presence of a suitable external magnetic field, and will otherwise be substantially anti-parallel (depending on the values of $\alpha$ and $\beta$; in any case, their components along $R_2$ will be precisely anti-parallel). Since the electrical resistance exhibited by the magnetoresistive structure depends on the relative orientation of $M_1$ and $M_2$, it is apparent that such a device will demonstrate clearly different resistance values for the "field on" and "field off" situations.

This will not automatically be the case if the first and second magnetic layers are strongly ferromagnetically coupled to one another, since $M_1$ and $M_2$ will then be substantially parallel in both the "field on" and "field off" situation (for relatively small values of $\alpha$ and $\beta$, at least). However, this problem can be alleviated by thus embodying the inventive device that the magnetic anisotropy of the first magnetic layer and the magnetic anisotropy of the second magnetic layer are of unequal magnitude. In such a device, $M_1$ and $M_2$ will be substantially parallel in zero field (for relatively small values of $\alpha$ and $\beta$; in any case, their components along $R_2$ will be precisely parallel), and application of an external magnetic field H will force both $M_1$ and $M_2$ to progressively rotate towards parallelism with H. However, if the magnetic anisotropy of the first layer is greater than that of the second layer, then this rotation process will be slower for $M_1$ than for $M_2$. As a result, the angle between $M_1$ and $M_2$ will steadily increase as H strengthens. In this manner, $M_1$ and $M_2$ can not be made anti-parallel, but they may at least be made substantially perpendicular (for sufficiently discrepant anisotropy values and a suitable value of H), in which configuration the device's electrical resistance will then be substantially different to that corresponding to the (nearly) parallel magnetisation configuration in zero field.

Discrepant magnetic anisotropies can, of course, also be employed in the previously-discussed case of antiferromagnetic coupling between the magnetic layers, though the advantage of such a measure in that case is not as pronounced as in the case of ferromagnetic coupling.

An interesting situation arises in the case of weak ferromagnetic coupling between the first and second magnetic layers. Assuming an oblong (e.g. rectangular) magnetoresistive multilayer structure in which $R_2$ is parallel to the long side, and assuming further that both $\alpha$ and $\beta$ are small (of the order of 15°, or less), the "field off" magnetisation configuration in the structure will be determined by two competing effects:

(i) The ferromagnetic coupling will tend to want to orient both $M_1$ and $M_2$ into a substantially parallel configuration straddling the axis $R_2$ (corresponding to a configuration as depicted in FIG. 6, excepting that $M_1$ or $M_2$ would then be reversed);

(ii) From the point of view of magnetostatic potential energy, a more stable configuration will be one whereby $M_1$ and $M_2$ are substantially anti-parallel, and straddle the axis $R_1$ (exactly as depicted in FIG. 6). This is because the virtual magnetic charge along the edges of the multilayer structure, and thus the demagnetising field, will be lower in this case than in case (i) above.

If effect (ii) is more dominant than effect (i), then the inventive structure can be switched between anti-parallel ("field off") and parallel ("field on") magnetisation configurations in essentially the same manner as the antiferromagnetically coupled structure discussed above. With a view to the comments made under point (a) earlier, such a structure is preferable to the "straightforward" ferromagnetically coupled structure discussed hereabove, and can be achieved in practice by ensuring a strong magnetic anisotropy in both the first and the second magnetic layers, and/or by employing a relatively thick non-magnetic interlayer (to weaken the ferromagnetic coupling between the magnetic layers).

A suitable and highly satisfactory material for use in the first and second magnetic layers is an alloy of composition $(Ni_xFe_{1-x})_yCo_{1-y}$, wherein $x>0$ and $y\leq 1$. In general, suitable values of x lie in the range 0.75–0.85 (typically, $x\approx 0.8$), whereas suitable values of y lie in the range 0.6–1.0 (typically, $y\approx 0.84$). Addition of Co to NiFe alloys (particularly permalloy) significantly increases their magnetic anisotropy. In addition, by embodying the first and second magnetic layers to have discrepant values of y, for example, these layers can relatively easily be endowed with magnetic anisotropies of substantially discrepant magnitude. This is of obvious advantage in the light of the above discussion. Further information on this topic can be gleaned from the article by Tolman in J. Appl. Phys., 1967, pp 3409–3410.

Suitable materials for use in the interposed non-magnetic layer include materials such as Cu, Ag and Au. All of these metals demonstrate a relatively large mean free path length, which makes them suitable to conserve the spin state of electrons in the metallic layers. In addition, their band structures are compatible with that of the aforementioned $(Ni_xFe_{1-x})_yCo_{1-y}$ alloys. However, in terms of lattice compatibility with such alloys (with a view to epitaxial growth), Cu enjoys a clear advantage over both Ag and Au, since the fcc lattice constant of FeNiCo alloys typically lies in the range 0.35–0.36 nm, that of Cu is 0.361 nm, and that of both Au and Ag is in excess of 0.4 nm.

In general, preferential thicknesses for the first and second magnetic layers lie in the range 5–10 nm, whereas the non-magnetic layer is preferably of thickness 3–5 nm.

In addition to the basic structure of a first magnetic layer, a second magnetic layer and an interposed non-magnetic layer, the magneto-resistive multilayer structure in the device according to the invention may of course comprise various additional layers, if so desired. For example, it may be embodied as a repetitive alternate arrangement of a large number of magnetic and non-magnetic layers (as in a NiFe/Cu superlattice). Alternatively, it may include special layers for the purpose of providing, for example, exchange-biasing (as with FeMn) or electrical insulation (as with $SiO_2$), or for improving growth quality (as with Ta or Fe buffer layers). In addition, the magnetic and non-magnetic layers may themselves be composite, if so desired (as in the case of a NiFe layer having a thin film of Co at its interface with a Cu layer, for example). Needless to say, the materials of the (two) magnetic layers do not have to be identical, as in the case of a NiFe/Cu/NiFeCo sandwich, for example. For the sake of clarity, the term "magnetic layer" as employed in this text should be interpreted as referring to a layer comprising ferromagnetic or ferrimagnetic material, or a mixture hereof. Such material may also incorporate small quantities of non-magnetic substances, e.g. for the purpose of influencing its magnetic properties (as in the case of Co which is doped with Os or Re, so as to influence its magnetic coercivity).

The magnetic and non-magnetic layers in the multilayer structure can be suitably provided by various means, such as sputter deposition (including ion-beam sputter deposition), vapour deposition (chemical or physical) or laser ablation deposition. All of these methods allow deposition of alloy materials (such as FeNiCo) either by co-deposition from several single-metallic targets or by deposition from an alloy target. The inventors have found sputter deposition to be particularly suited to the present invention.

The invention and its advantages will be further elucidated with the aid of exemplary embodiments and the accompanying schematic drawings, not all of uniform scale, whereby:

FIG. 1 gives a perspective view of a magneto-resistive multilayer structure suitable for use in a device in accordance with the invention;

FIG. 2 renders a perspective view of the subject of FIG. 1, after its provision with exemplary electrical contact leads;

Figure 3:
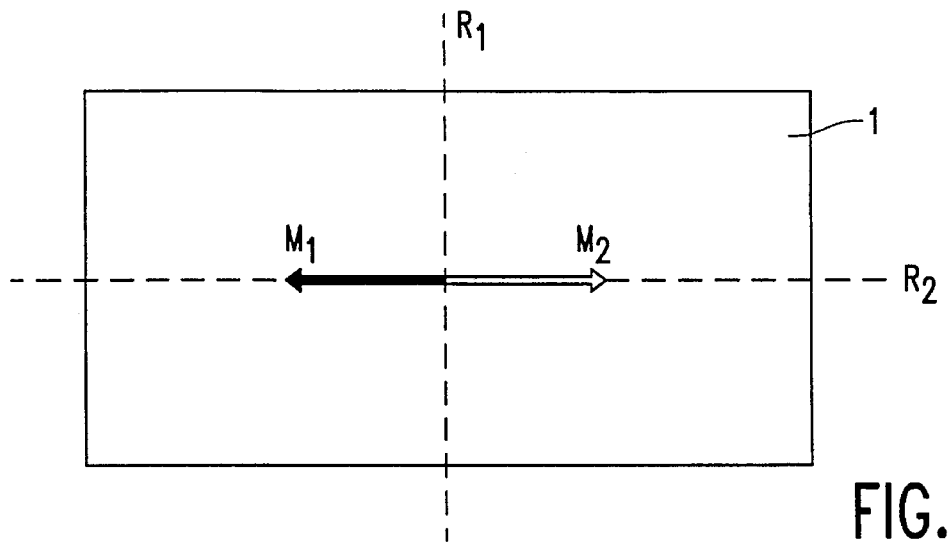
FIG. 3 is a plan view of a multilayer structure similar to that depicted in FIG. 1 but not in accordance with the present invention, and schematically shows the structure's magnetisation configuration in zero field.
Figure 4:
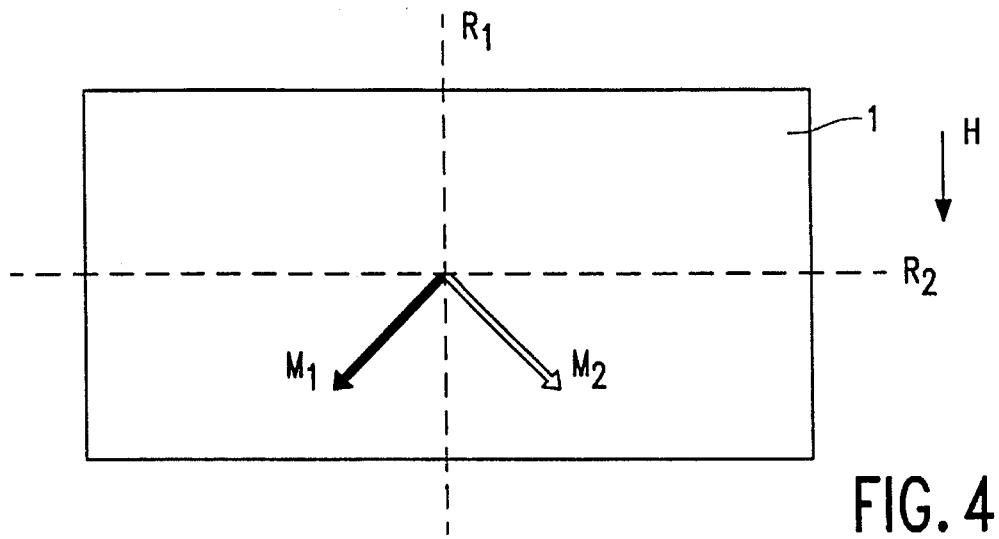
FIG. 4 depicts the subject of FIG. 3 under the influence of a relatively small external magnetic field.
Figure 5:
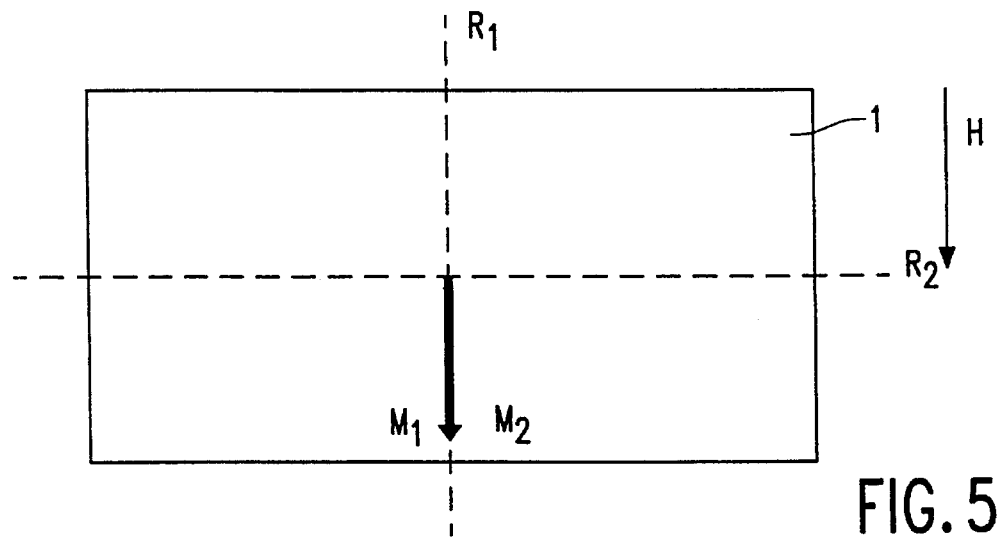
FIG. 5 shows the subject of FIG. 4 in a state of saturation, after a sufficient increase in the strength of the external magnetic field.
Figure 8:
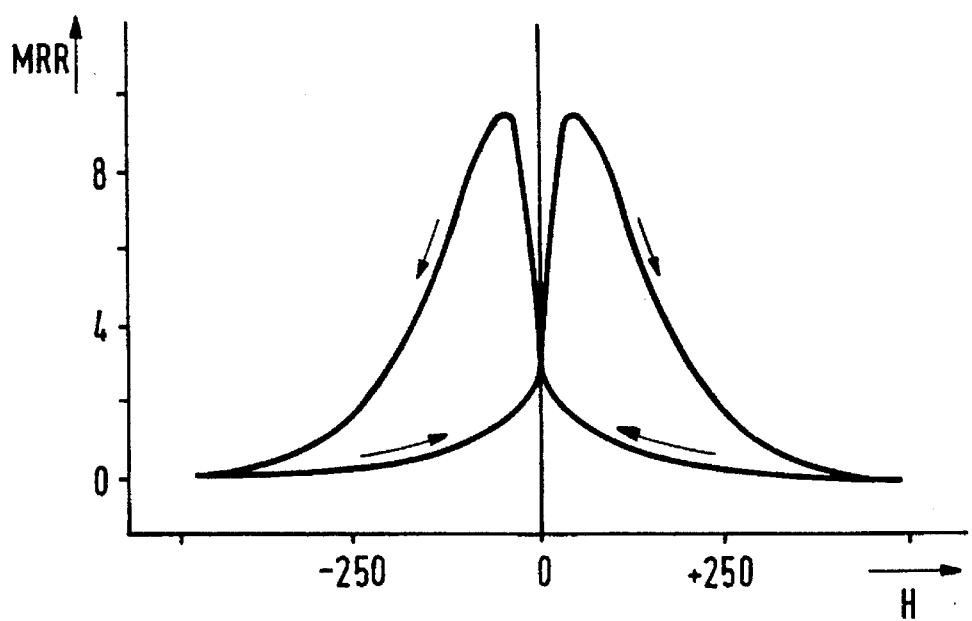
Figure 9:
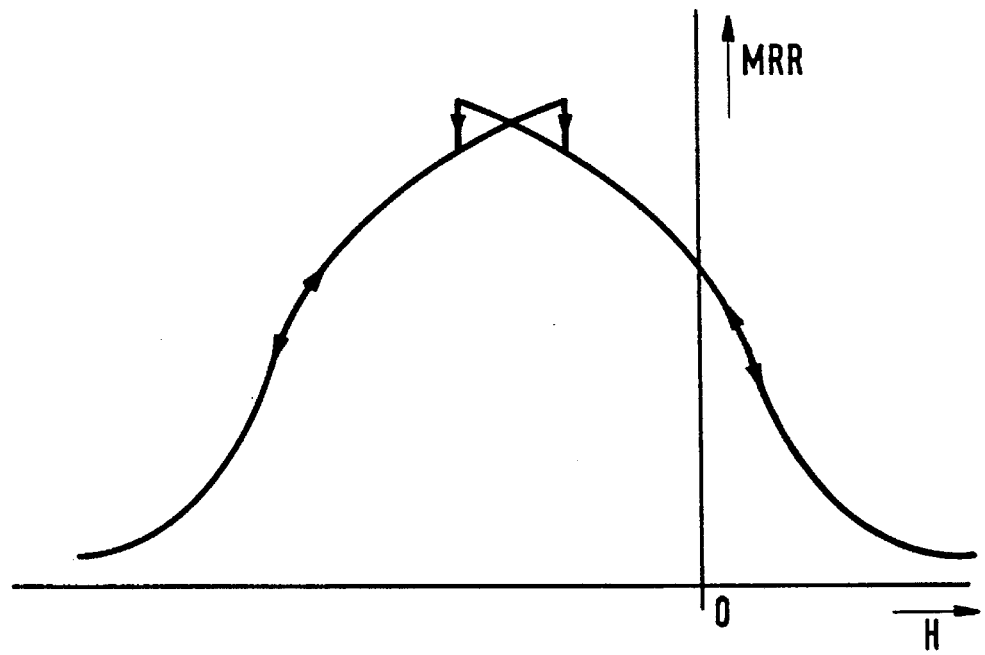
Figure 10:
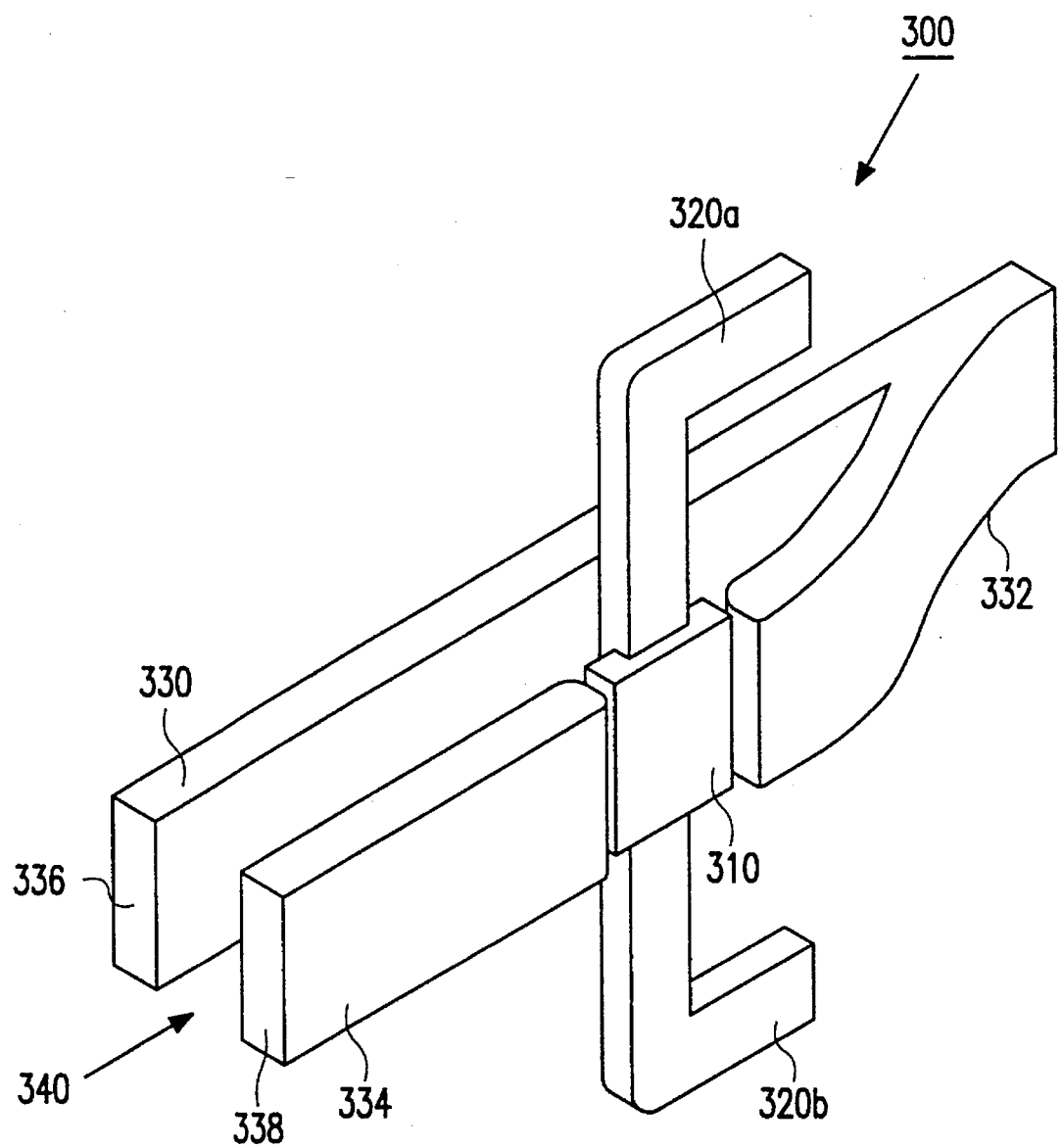

FIG. 8 graphically depicts the magnetic field dependence of the magneto-resistance ratio in a non-inventive device such as that to which FIGS. 3–5 pertain;

FIG. 9 graphically depicts the magnetic field dependence of the magneto-resistance ratio in a device in accordance with the current invention;

FIG. 10 is a highly-schematic perspective view of a magnetic head incorporating a magnetic field sensing device in accordance with the invention.

Figure 1:
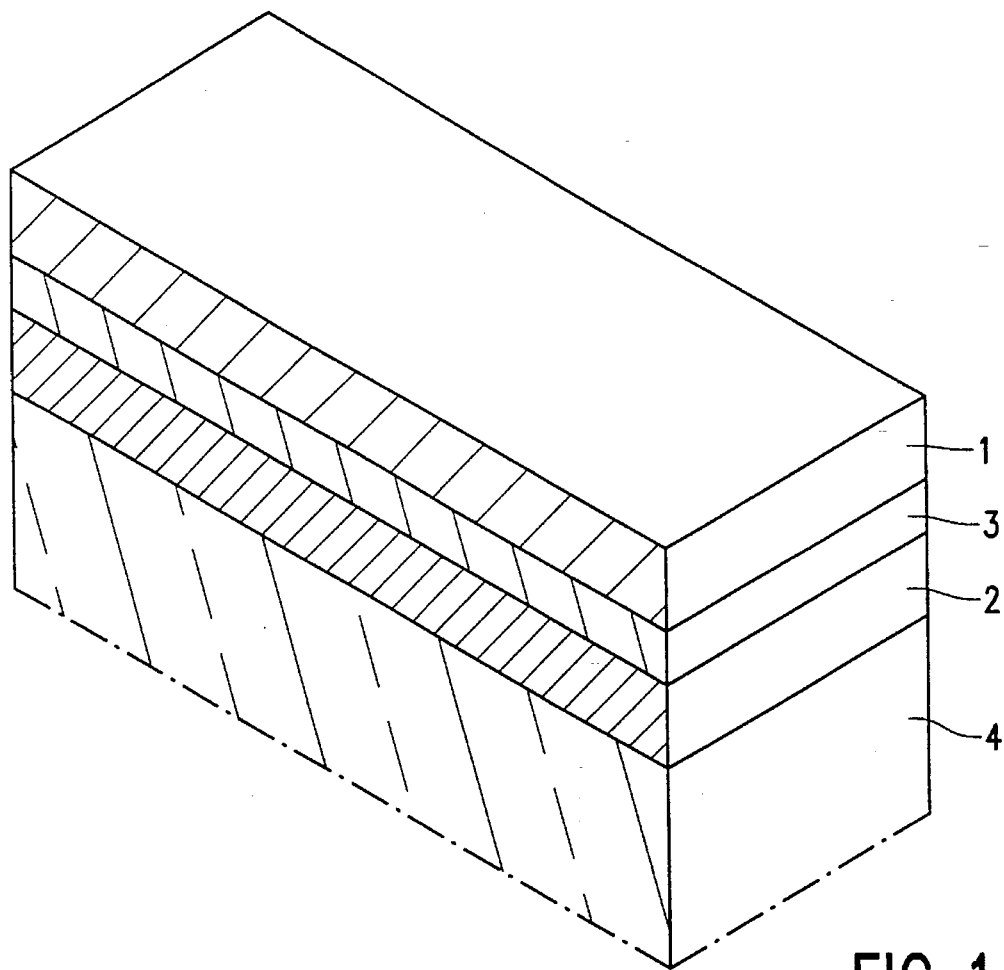

FIG. 1 is a schematic perspective view of an exemplary magneto-resistive multilayer structure suitable for use in a magnetic field sensing device in accordance with the invention. The structure comprises a first magnetic layer 1 and a second magnetic layer 2, which are separated by an interposed non-magnetic layer 3. The various layers are deposited on an electrically insulating substrate 4 (comprising $SiO_2$, for example). In practice, a thin Fe or Ta layer (typically 2–4 nm thick) is often provided on the substrate 4 prior to deposition of layer 2, so as to promote adhesion and improve growth.

Figure 2:
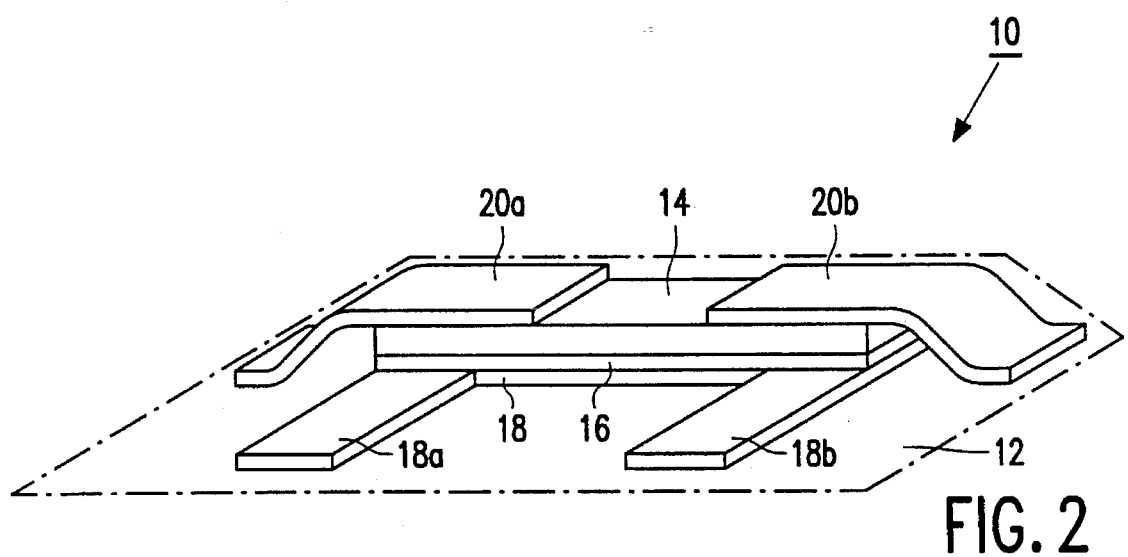

FIG. 2 renders a perspective view of a magnetic field sensing device 10 which is manufactured on a base 12 of soft-magnetic material (e.g. permalloy). An oblong magneto-resistive multilayer structure 14 is separated from a base electrode 18 by a layer 16 of electrically insulating material (e.g. $SiO_2$). The electrode 18 is provided with electrical contacts 18a, 18b. In addition, the upper surface of the multilayer structure 14 is provided with electrical contacts 20a, 20b at opposite extremities. A variable external magnetic field can be fed (e.g. via a non-depicted magnetic yoke) to the magneto-resistive structure 14, where it is translated into a variable electrical resistance measurable via the contacts 20a, 20b. In addition, the assembly 18a, 18, 18b can be used (if so desired) to run a so-called biasing current parallel to the structure 14, which in turn induces a biasing magnetic flux in the structure 14. This biasing magnetic flux can be used to improve the measurement linearity of the device 10, and reduce residual hysteresis by increasing switching fields.

As here depicted, the local direction of this biasing flux at the upper surface of the multilayer structure 14 will be substantially parallel to the short side of that surface, i.e. perpendicular to the direction of a sensing current $I_s$ flowing from contact 20a to contact 20b. It is general practice to thus orient the device 10 that the external magnetic field H to be sensed by the device is also locally oriented perpendicular to $I_s$. In other words, $R_2$ is generally the direction in which the sensing current is directed.

Embodiment 1 (not in accordance with the invention)

FIGS. 3–5 render plan views of a multilayer structure similar to that depicted in FIG. 1 but not in accordance with the present invention, and schematically show the structure's magnetisation configuration for various values of an externally applied magnetic field. Corresponding features in the three Figures are denoted by the same reference symbols. Referring back to FIG. 1, the magnetic layers 1 and 2 in this particular embodiment are antiferromagnetically coupled to one another, and their easy axes are parallel (in conflict with the stipulation of the current invention).

FIG. 3 shows the "field off" magnetisation configuration, whereby the magnetisation vector $M_1$ of layer 1 is antiparallel to the magnetisation vector $M_2$ of layer 2. Both $M_1$ and $M_2$ are oriented along their respective easy axes, which coincide with the reference axis $R_2$.

In FIG. 4, a relatively weak external magnetic field H has been applied along the reference axis $R_1$ perpendicular to the reference axis $R_2$, as shown. In reaction hereto, the magnetisation vectors $M_1$ and $M_2$ have rotated towards $R_1$, in an attempt to align themselves with H.

In FIG. 5, the sample has been brought into magnetic saturation, since H has been increased to such a value that both $M_1$ and $M_2$ are fully aligned with it, and are thus both parallel to $R_1$. The depicted magnetisation configuration is metastable, since, when the external field H is weakened again, each magnetisation $M_1$, $M_2$ can start to relax back towards $R_2$ in either of two directions (namely clockwise or anti-clockwise), which are energetically equivalent. In practice, relaxation will therefore be accompanied by (undesirable) domain wall formation, as the spatial M-distribution splits into separate parts which relax towards $R_2$ in different directions.

This splitting leads to magnetic hysteresis, a type of which is graphically rendered in FIG. 8, in which a so-called "butterfly diagram" is depicted. This diagram plots the magneto-resistance ratio MRR (in %) as a function of external magnetic field strength (in Oe). The curves for increasing and decreasing values of H show a pronounced non-coincidence in this typical case.

Embodiment 2

Figure 6:
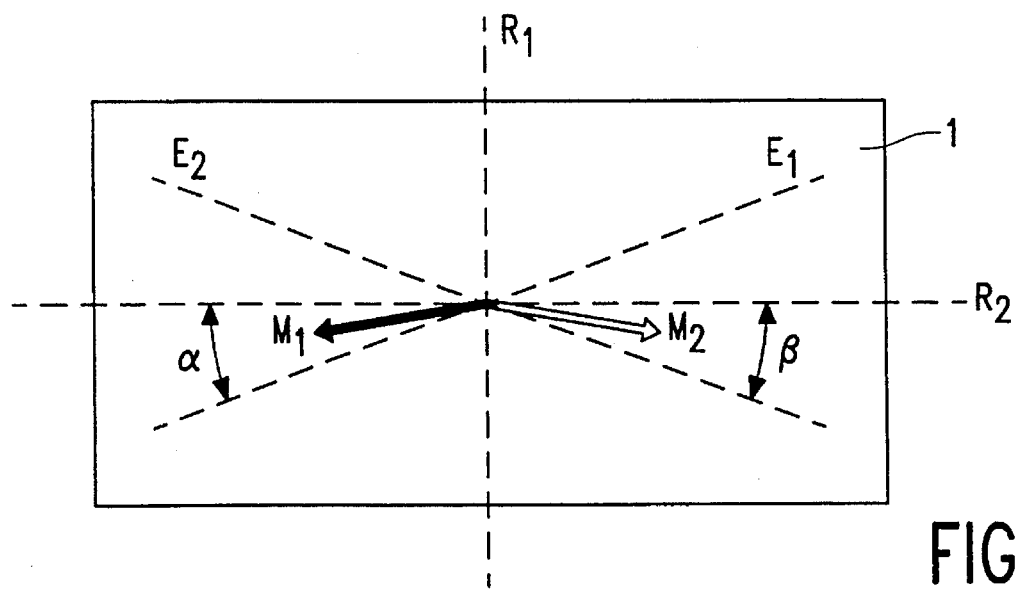
FIG. 6 is a plan view of a multilayer structure as depicted in FIG. 1 and in accordance with the present invention, and schematically shows the structure's magnetisation configuration in zero field.
Figure 7:
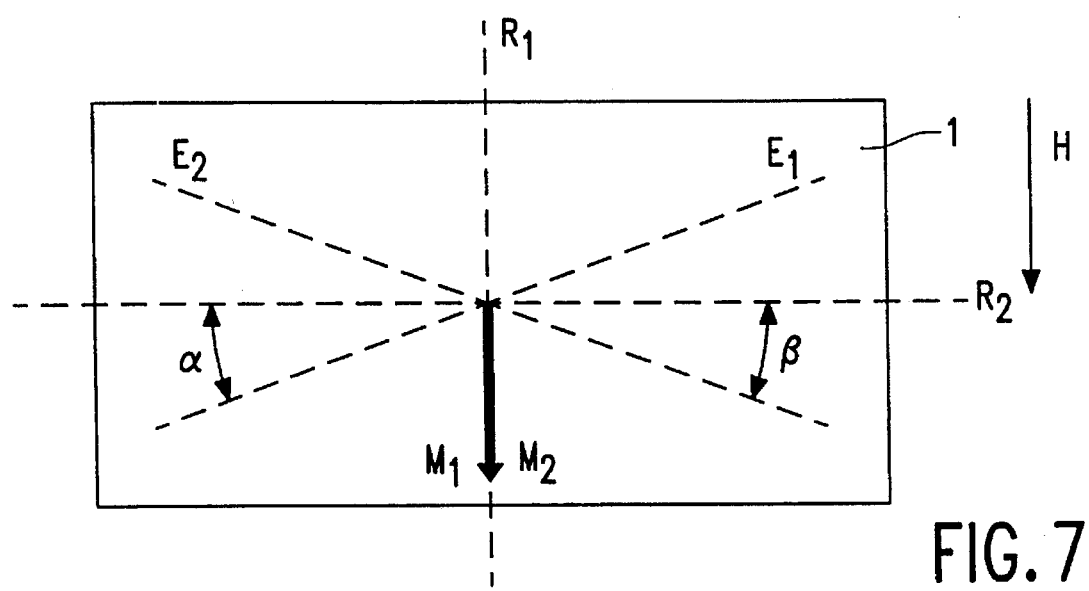
FIG. 7 depicts the subject of FIG. 6 in a state of saturation under the influence of a sufficiently strong external magnetic field.

FIGS. 6 and 7 render plan views of a multilayer structure as depicted in FIG. 1 and in accordance with the present invention, and schematically show the structure's magnetisation configuration for different values of an externally applied magnetic field. Corresponding features in the two Figures are denoted by the same reference symbols. Referring back to FIG. 1, the magnetic layers 1 and 2 are antiferromagnetically coupled to one another in this particular embodiment. In accordance with the invention, the magnetic easy axis $E_1$ of layer 1 is canted anti-clockwise through an angle $\alpha$ with respect to reference axis $R_2$, whereas the magnetic easy axis $E_2$ of layer 2 is canted clockwise through an angle $\beta$ with respect to $R_2$. As a result, the easy axes $E_1$, $E_2$ straddle the reference axis $R_2$.

FIG. 6 shows the "field off" magnetisation configuration, in which the magnetisation $M_1$ of layer 1 and the magnetisation $M_2$ of layer 2 are not exactly anti-parallel, but are both tilted away from $R_2$. This tilting is caused by the inventive skewing of the axes $E_1$ and $E_2$, which inhibits the tendency of $M_1$ and $M_2$ to align in exact anti-parallelism in response to the antiferromagnetic coupling between layers 1 and 2 (and any demagnetising fields).

In FIG. 7, the sample has been brought into magnetic saturation, under the influence of a sufficiently strong magnetic field H applied along $R_1$. $M_1$ and $M_2$ are therefore both parallel to $R_1$. The depicted magnetisation configuration is not metastable, since, when the external field H is weakened again, each of the magnetisations $M_1$, $M_2$ will have an unambiguous "easiest path" back to its original orientation. This "easiest path" (i.e. shortest, most energetically favourable route) is clockwise for $M_1$ and counter-clockwise for $M_2$. Domain wall formation is therefore strongly inhibited in this case, and magnetic hysteresis is significantly reduced.

This is clearly apparent from FIG. 9, which graphically depicts the magneto-resistance ratio MRR as a function of applied magnetic field strength H (both in arbitrary units) for an ideal magneto-resistive multilayer structure embodied according to the invention.

The graph in FIG. 9 is displaced to the left of the MRR axis as a result of an appropriately chosen magnetic biasing field (as discussed hereabove with reference to FIG. 2). This biasing places the MRR axis (i.e. H=0 axis) in a hysteresis-free and more-or-less linear region of the graph.

Embodiment 3

FIG. 10 is a schematic perspective view of a magnetic head 300 comprising an inventive magnetic field sensing device 310 with electrical connections 320a, 320b. The head 300 further comprises flux guides 330, 332, 334, which are positioned relative to the device 310 so as to form a magnetic circuit therewith. The end faces 336, 338 form part of the pole face of the magnetic head 300, the magnetic gap 340 being located between said faces 336, 338.

If a magnetic medium, such as a magnetic tape or disc, passes before the faces 336, 338 in close proximity thereto, the magnetically-stored information on that medium will generate a varying magnetic flux in the above-mentioned magnetic circuit. This varying flux is fed to the magneto-resistive device 310, where it is transcribed into electrical resistance variations measurable via the electrical connections 320a, 320b.

The magnetic head may also contain an electrical coil, which can be employed in the recording of magnetic information on magnetic media.

Assuming the device 310 and the electrical connections 320a, 320b to correspond respectively to the device 10 and electrical contacts 20a, 20b in FIG. 2, then, as here depicted, the magnetic flux provided by the yoke assembly in FIG. 10 to the magneto-resistive multilayer structure 14 in FIG. 2 would be oriented parallel to the short side of the oblong structure 14, and would therefore be perpendicular to a sensing current flowing parallel to the structure's long side between contacts 20a and 20b. This is a commonly employed geometry.

We claim:

1. A device for detecting a magnetic field, said device comprising a magneto-resistive multilayer structure comprising a first magnetic layer separated from a second magnetic layer only by an interposed non-magnetic layer, said multilayer structure having a first in-plane reference axis coinciding with the direction in which magnetic flux produced by said magnetic field is effected by said multilayer structure during operation, and a second in-plane reference axis which is perpendicular to said first reference axis, characterized in that said first magnetic layer has a magnetic easy axis $E_1$ with in-plane components along said first reference axis and said second reference axis where $E_1$ is canted through an acute in-plane angle α of greater than 0° and less than 45° with respect to said second reference axis and that said second magnetic layer has a magnetic easy axis $E_2$ with in-plane components along said first reference axis and said second reference axis where $E_2$ is canted through an acute in-plane angle β of greater than 0° and less than 45° with respect to said second in-plane reference axis the components of $E_1$ and $E_2$ along said second reference axis being anti-parallel.

2. A device according to claim 1, characterised in that neither α nor β exceeds 20°.

3. A device according to claim 2, characterized in that the first magnetic layer and the second magnetic layer are antiferromagnetically coupled to one another.

4. A device according to claim 2, characterized in that the magnetic anisotropy of the first magnetic layer and the magnetic anisotropy of the second magnetic layer are of unequal magnitude.

5. A device according to claim 2, characterized in that the first and second magnetic layers comprise $(Ni_xFe_{1-x})_yCo_{1-y}$ alloy, $x>0$, $y \leq 1$.

6. A device according to claim 1, characterised in that the first magnetic layer and the second magnetic layer are antiferromagnetically coupled to one another.

7. A device according to claim 6, characterized in that the magnetic anisotropy of the first magnetic layer and the magnetic anisotropy of the second magnetic layer are of unequal magnitude.

8. A device according to claim 6, characterized in that the first and second magnetic layers comprise $(Ni_xFe_{1-x})_yCo_{1-y}$ alloy, $x>0$, $y \leq 1$.

9. A device according to claim 1, characterized in that the magnetic anisotropy of the first magnetic layer and the magnetic anisotropy of the second magnetic layer are of unequal magnitude.

10. A device according to claim 9, characterized in that the first and second magnetic layers comprise $(Ni_xFe_{1-x})_yCo_{1-y}$ alloy, $x>0$, $y \leq 1$.

11. A device according to claim 1, characterized in that the first and second magnetic layers comprise a $(Ni_xFe_{1-x})_yCo_{1-y}$ alloy, $x>0$, $y \leq 1$.

12. A device according to claim 1, characterized in that the interposed non-magnetic layer comprises Cu.

13. A magnetic head incorporating a device according to claim 1.

14. A device according to claim 1, characterized in that the first magnetic layer and the second magnetic layer are antiferromagnetically coupled to one another.

15. A device according to claim 1, characterized in that the magnetic anisotropy of the first magnetic layer and the magnetic anisotropy of the second magnetic layer are of unequal magnitude.

16. A device according to claim 1, characterized in that the first and second magnetic layers comprise $(Ni_xFe_{1-x})_yCo_{1-y}$ alloy, $x>0$, $y \leq 1$.

17. A device according to claim 1, characterized in that the interposed non-magnetic layer comprises Cu.

* * * * *